United States Patent [19]

Veenendaal

[11] Patent Number: 5,095,616

[45] Date of Patent: Mar. 17, 1992

[54] GROUNDING METHOD FOR USE IN HIGH FREQUENCY ELECTRICAL CIRCUITRY

[75] Inventor: Cornelis T. Veenendaal, Hillsboro, Oreg.

[73] Assignee: Tektronix, Inc., Beaverton, Oreg.

[21] Appl. No.: 604,040

[22] Filed: Oct. 26, 1990

[51] Int. Cl.$^5$ .......................... H05K 3/00; H05K 3/44
[52] U.S. Cl. .......................... 29/829; 29/830; 29/848; 174/52.4; 333/246; 333/247; 361/424
[58] Field of Search .................. 361/424; 29/846, 830, 29/848, 829; 174/35 R; 154/64; 428/901; 439/84, 85; 333/246, 247

[56] References Cited

U.S. PATENT DOCUMENTS

| | | | |
|---|---|---|---|
| 3,389,461 | 6/1968 | Hardardt | 29/848 |
| 3,786,375 | 1/1974 | Sato et al. | 174/52.4 X |
| 4,092,664 | 5/1978 | Davis, Jr. | 333/247 X |
| 4,650,054 | 3/1987 | Laakso et al. | 156/655 |
| 4,741,101 | 5/1988 | Berg et al. | 29/848 |
| 4,777,456 | 10/1988 | Andrikian et al. | 333/246 X |

FOREIGN PATENT DOCUMENTS

| | | | |
|---|---|---|---|
| 55-53902 | 4/1980 | Japan | 29/830 |
| 1-59993 | 3/1989 | Japan | 361/424 |
| 1-67997 | 3/1989 | Japan | 361/424 |
| 2-77199 | 3/1990 | Japan | 361/424 |

Primary Examiner—Carl J. Arbes
Attorney, Agent, or Firm—Francis I. Gray

[57] ABSTRACT

A grounding method for use in high frequency electrical circuitry has a conductive elastomeric member with a low resistivity per square. The conductive elastomeric member is placed in contact with the ground plane of a circuit board and a conductive housing within which the circuit board is situated. The conductive elastomeric member is deformed to flow into discontinuities of a ground path between the ground plane and the conductive housing so that the discontinuities do not act as antennae to radiate energy in response to high frequency signals.

9 Claims, 1 Drawing Sheet

GROUNDING METHOD FOR USE IN HIGH FREQUENCY ELECTRICAL CIRCUITRY

BACKGROUND OF THE INVENTION

The present invention relates to high frequency electrical circuitry, and more particularly to a grounding method for use in such high frequency electrical circuitry to eliminate radiation caused by discontinuities in a ground path.

In high frequency electrical circuitry cracks or breaks in a ground path act as antennae that radiate energy at high frequencies. This energy is disruptive in high frequency signal applications. For electrical signals having frequencies in the high gigahertz range, such as 20-40 GHz and above, obvious grounding methods between circuit board ground planes and conductive housing walls using metallic contacts leave gaps between the ground planes and housing walls adjacent to the circuit boards, which gaps form antennae at high frequencies. These antennae radiate energy at resonant frequencies and harmonics thereof that are directly related to the dimensions of the gaps.

What is desired is to have a grounding method for use in high frequency electrical circuitry that eliminates cracks and breaks in a ground path between a circuit board and a housing that can act as antennae in order to eliminate radiation of spurious energy that could produce erroneous measurement of a high frequency input signal.

SUMMARY OF THE INVENTION

Accordingly the present invention provides a grounding method for use in high frequency electrical circuitry that assures an electrical ground path free of any cracks and discontinuities. An elastomeric material is impregnated with a conductive material or otherwise provided with conductive paths on its surface to produce a conductive elastomer having a very low resistance. The conductive elastomer is placed within a cavity in a conductive housing within which a circuit board having a ground plane is situated so as to provide electrical connectivity between the ground plane and the conductive housing. The conductive elastomer is slightly larger than the cavity so that when a lid is secured to the housing to enclose the cavity, pressure is applied to the conductive elastomer to cause the conductive elastomer to deform to fill any ground path discontinuities that might otherwise exist.

The objects, advantages and other novel features of the present invention are apparent from the following detailed description when read in conjunction with the appended claims and attached drawing.

DESCRIPTION OF THE PREFERRED EMBODIMENT

Figure 1:
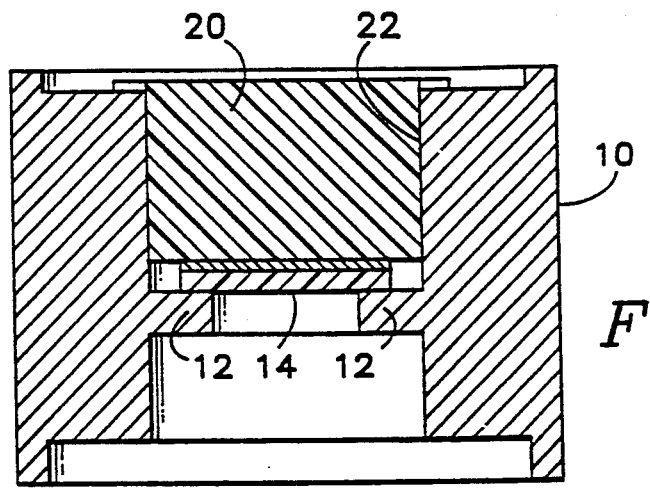
FIG. 1 is a cross-section view of a housing with included circuit board using the grounding method of the present invention.
Figure 2:
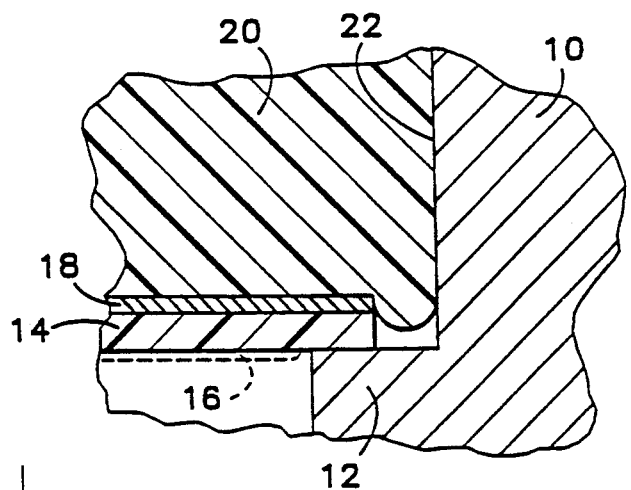
FIG. 2 is an exploded view of a portion of the cross-section view of FIG. 1.

Referring now to FIGS. 1 and 2 a conductive housing 10, made of a material such as brass or the like, has an integral circuit board support platform 12 upon which a circuit board 14 is mounted. The circuit board 14 has an electronic circuit side 16 and a ground plane side 18. A conductive elastomeric member 20 has a form that fills a region 22 over the circuit board 14 with a height that is slightly greater than the region height when a lid is secured to the housing 10 to enclose the region. The conductive elastomeric member 20 may be formed by impregnating a flexible polymer, such as silicon rubber, with silver particles to a degree that results in a resistivity of no more than one ohm per square. The silver filled polymer part is a relatively thin sheet that is placed in the bottom of a transfer mold and backfilled with pure flexible polymer material. Alternatively a sacrificial substrate, such as copper, may have closely spaced conductive leads, such as four mil wide leads with four mil spacing, of a material such as gold laid on it to form a flexible connector circuit. The flexible connector circuit is placed in the bottom of a transfer mold and backfilled with a flexible polymeric material. The sacrificial substrate is then removed. Another alternative is just to impregnate an elastomeric block in a mold with conductive material, such as silver. In all embodiments the resistivity of the surfaces that contact the ground plane 18 of the circuit board 14 and the walls of the housing 10 is less than one ohm per square, and preferably as low as 0.2 ohms per square.

Figure 3:
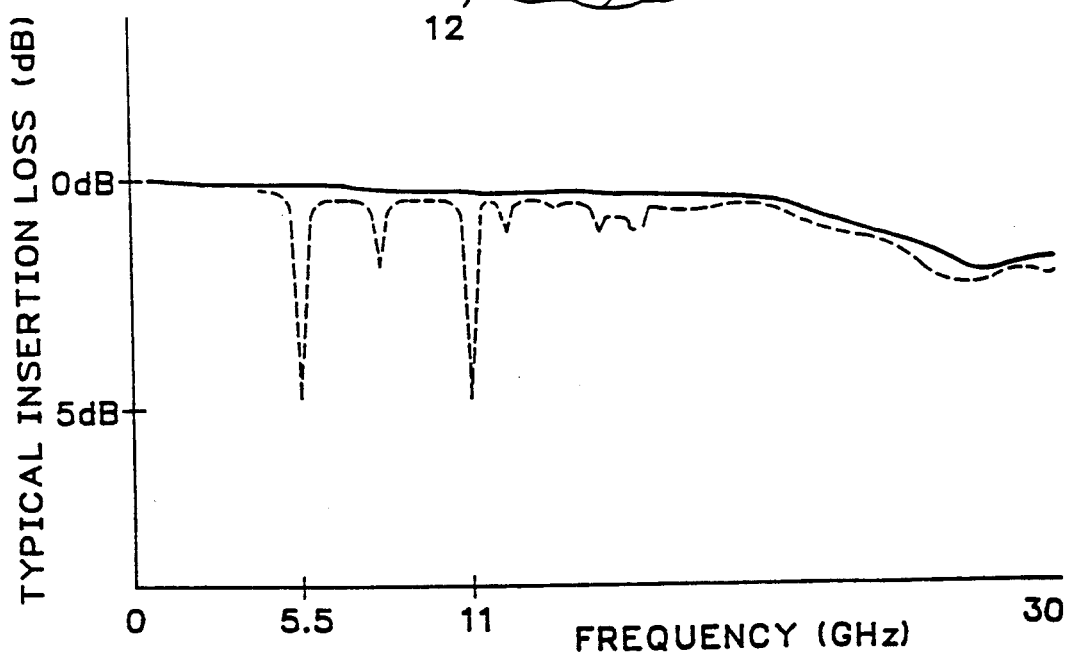
FIG. 3 is a graphic view of the radiation reduction resulting from using the grounding method of the present invention.

As shown in greater detail in FIG. 2 when the lid is placed over the region 22 and secured to the housing 10, pressure is applied to the conductive elastomeric member 20, causing the member to deform. The deformation of the conductive elastomeric member 20 results in the filling of all the discontinuities in the ground path between the ground plane 18 of the circuit board 14 and the walls of the housing 10. This assures good grounding of the circuit board 14 without the formation of "antennae" due to discontinuities that could radiate part of the high frequency signal from the circuit board. FIG. 3 illustrates the harmonic radiations at 5.5 and 11 GHz, as well as several smaller resonances, that occur using conventional metallic grounding methods or with insufficient pressure upon the conductive elastomer 20 (shown by the dotted line), and the lack of such resonances (shown by the solid line) using the grounding method of the present invention with an appropriate pressure upon the conductive elastomer as described above.

Thus the present invention provides a grounding method for use in high frequency electrical circuitry that uses a compressed conductive elastomer within a cavity to provide a discontinuity free ground path between a circuit board and a cavity wall.

What is claimed is:

1. A method of grounding a circuit board in a high frequency environment, the circuit board having a ground plane on one side, to a conductive housing within which the circuit board is situated comprising the steps of:
    forming a conductive elastomer having a low resistivity per square, the conductive elastomer having a configuration to fill a cavity within the conductive housing formed between the circuit board and walls of the conductive housing;
    placing the conductive elastomer within the cavity to provide electrical contact between the ground plane of the circuit board and the walls of the conductive housing; and deforming the conductive elastomer to cause the conductive elastomer to flow into discontinuities in a ground path between the ground plane and the walls to prevent radiation of energy from the discontinuities.

2. A method as recited in claim 1 wherein the forming step comprises the step of impregnating a block of elastomeric material with a conductive material to form the conductive elastomer.

3. A method as recited in claim 1 wherein the forming step comprises the steps of:
    filling a relatively thin sheet of flexible polymer with a conductive material to produce a conductive sheet;
    placing the conductive sheet in the bottom of a mold; and
    backfilling the conductive sheet with a flexible polymer material to produce the conductive elastomer.

4. A method as recited in claim 1 wherein the forming step comprises the steps of:
    laying a plurality of closely spaced electrical conductors on a sacrificial substrate to form a flexible connector sheet;
    placing the flexible connector sheet in the bottom of a mold;
    backfilling the flexible connector sheet with a flexible polymer material to cover the conductors; and
    removing the sacrificial substrate to produce the conductive elastomer.

5. An apparatus for grounding a circuit board, the circuit board having a ground plane on one side, to a conductive housing within which the circuit board is situated comprising:
    a conductive elastomer having a low resistivity per square, the conductive elastomer being situated within the housing and being positioned to provide electrical connection between the ground plane and the conductive housing; and
    means for deforming he conductive elastomer to cause the conductive elastomer to flow into discontinuities of a ground path between the ground plane and the conductive housing to eliminate spurious energy radiation caused by the discontinuities in response to high frequency signals.

6. An apparatus as recited in claim 5 wherein the conductive elastomer comprises a block of elastomeric material impregnated with a conductive material.

7. An apparatus as recited in claim 5 wherein the conductive elastomer comprises:
    a sheet of a flexible polymer filled with a conductive material; and
    a backing of a flexible polymer material adhered to the sheet of the flexible polymer.

8. An apparatus as recited in claim 5 wherein the conductive elastomer comprises a block of flexible polymer material having a plurality of conductive leads laid on the surface of the block.

9. A method of manufacturing a conductive elastomeric member comprising the steps of:
    laying a plurality of closely spaced electrical conductors on a sacrificial substrate to form a flexible connector sheet;
    placing the flexible connector sheet in the bottom of a mold;
    backfilling the flexible connector sheet with a flexible polymer material covering the conductors; and
    removing the sacrificial substrate to produce the conductive elastomeric member.

* * * * *